(12) United States Patent
Möller et al.

(10) Patent No.: US 11,087,036 B2
(45) Date of Patent: Aug. 10, 2021

(54) CONSTRUCTION TASK REFERENCING

(71) Applicant: LEICA GEOSYSTEMS AG, Heerbrugg (CH)

(72) Inventors: Bernd Möller, Lüchingen (CH); Thomas Ammer, Widnau (CH)

(73) Assignee: LEICA GEOSYSTEMS AG, Heerbrugg (CH)

( * ) Notice: Subject to any disclaimer, the term of this patent is extended or adjusted under 35 U.S.C. 154(b) by 209 days.

(21) Appl. No.: 16/548,738

(22) Filed: Aug. 22, 2019

(65) Prior Publication Data
US 2020/0065432 A1    Feb. 27, 2020

(30) Foreign Application Priority Data

Aug. 22, 2018 (EP) ..................................... 18190344

(51) Int. Cl.
*G06F 30/13* (2020.01)
*G06F 16/903* (2019.01)

(52) U.S. Cl.
CPC ........ *G06F 30/13* (2020.01); *G06F 16/90335* (2019.01)

(58) Field of Classification Search
None
See application file for complete search history.

(56) References Cited

U.S. PATENT DOCUMENTS

| | | | |
|---|---|---|---|
| 8,345,926 B2* | 1/2013 | Clark | ........................... 382/106 |
| 8,422,035 B2 | 4/2013 | Hinderling et al. | |
| 9,200,900 B2 | 12/2015 | Fessler et al. | |
| 9,233,751 B2 | 1/2016 | Metzler | |
| 9,752,863 B2 | 9/2017 | Hinderling et al. | |

(Continued)

FOREIGN PATENT DOCUMENTS

| | | |
|---|---|---|
| CN | 103886139 A | 6/2014 |
| EP | 2 053 353 A1 | 4/2009 |

(Continued)

OTHER PUBLICATIONS

Extended European Search Report dated Jan. 31, 2019 as received in Application No. 18190344.4.

*Primary Examiner* — Craig C Dorais
(74) *Attorney, Agent, or Firm* — Maschoff Brennan

(57) ABSTRACT

A method, device and system for automatically deriving stationing zones for an electronic measuring or marking device in a worksite environment. The method includes querying a database (DB) for a construction plan information for the worksite environment and acquiring a worksite-task-information of a worksite-task to be executed. The worksite-task-information includes spatial points in the construction plan which have to be measured and/or marked to accomplish the worksite-task. It also comprises an acquiring of at least coarse 3D-data of the actual real world worksite environment, and a merging of the at least coarse 3D-data and the construction plan information to form an actual state model of the worksite environment. An automatic calculating of at least one stationing zone within the actual state model is established, the stationing zone including at least one stationing location from which the measuring or marking of the spatial points are accessible by the device without obstructions.

15 Claims, 5 Drawing Sheets

(56) References Cited

U.S. PATENT DOCUMENTS

| | | |
|---|---|---|
| 9,753,135 B2 | 9/2017 | Bosch |
| 2006/0041842 A1* | 2/2006 | Loberg .................... G06T 15/00 715/700 |
| 2009/0219199 A1* | 9/2009 | Borchert ................ G02B 27/01 342/357.31 |
| 2012/0130675 A1 | 5/2012 | Schorr et al. |
| 2013/0326892 A1 | 12/2013 | Schorr |
| 2014/0192159 A1 | 7/2014 | Chen et al. |
| 2014/0268064 A1 | 9/2014 | Kahle et al. |
| 2015/0029489 A1 | 1/2015 | Metzler et al. |

FOREIGN PATENT DOCUMENTS

| | | |
|---|---|---|
| EP | 2 453 205 A1 | 5/2012 |
| EP | 2 458 328 A1 | 5/2012 |
| EP | 2 502 712 A1 | 9/2012 |
| EP | 2 511 659 A1 | 10/2012 |
| EP | 2 523 017 A1 | 11/2012 |
| EP | 2 620 746 A1 | 7/2013 |
| EP | 2 629 210 A1 | 8/2013 |
| EP | 2 698 602 A1 | 2/2014 |
| EP | 2 781 880 A1 | 9/2014 |
| EP | 3 054 404 A1 | 8/2016 |
| EP | 3 222 969 A1 | 9/2017 |
| JP | 2011-247677 A | 12/2011 |
| JP | 5489310 B1 | 5/2014 |

* cited by examiner

CONSTRUCTION TASK REFERENCING

CROSS-REFERENCE TO RELATED APPLICATIONS

This application claims priority to European Patent Application No. 18190344, filed on Aug. 22, 2018. The foregoing patent application is herein incorporated by reference.

FIELD OF INVENTION

The present invention relates generally to a method for automatically deriving stationing zones for an electronic measuring and/or marking device in a worksite environment, as well as to a corresponding device, system and computer program product.

BACKGROUND

On a construction site, in particular for buildings, many tasks require a spatial referencing. To achieve or assist such a referencing, the electronic tools which are used therefore are preferably provided with access to digital information regarding the task to be executed, the construction site, plans, manuals, etc. For example, it is known from EP 3 222 969 to have an electronic measuring device for an automated spatial referencing at a worksite, which can interact with a Building Information Modeling (BIM) system, like e.g. Worksite management methods and systems as in EP 3 054 404, EP 2 629 210, US 2014/268064, CN 103886139, JP 5489310, US 2014/192159, etc.

Some examples of marking and/or measurement devices that can be used, modified or being related to in context of the present invention, in particular with respect to spatial referencing, measuring and marking are e.g.: EP 2 698 602, showing a handheld tool for electronic distance measurement (=EDM) with a support that has an angular joint providing angular reference information for gathering geometrical data of a room. EP 2 458 328 shows a surveillance instrument for measuring and marking points at a construction site, e.g. for plumbing. In EP 2 781 880 a construction laser system with a self-leveling laser rotator and a laser receiver is shown. EP 2 053 353 shows a reference line projection unit with an EDM and a visible reference laser beam guided along a defined reference path. EP 2 453 205 shows a surveying instrument with an EDM, angular sensors and a camera unit, which provides a scanning function for determining a point cloud. EP 2 620 746 suggests an instrument for surveying and marking spatial coordinates at an arbitrary shaped surface. In EP 2 502 712, a method and system for determining the position of a hand-held power tool on a wall is presented.

Besides such more or less primarily dedicated measurement and/or marking devices, handheld computing devices such as a tablet-computers, smart phones, smart watches, laptops, VR-Headset, AR-glasses, etc. are almost omnipresent at worksites. Besides their communication and quasi real time world wide data access capabilities, those devices can also comprise local storage and different kinds of sensors. For example, inertial measurement units (IMU), navigation systems, environmental sensors, 2D camera systems and/or 3D camera systems, like stereo-imaging-, triangulation-, structured-light-, time-of-flight-range-imaging-systems, radio-communication and radio-navigation system, global and local data links like Bluetooth, infrared, ultrasound, ZigBee, near-field-communication, etc. can often be found in embodiments of such devices. Also, corresponding software frameworks and APIs e.g. for outdoor- and/or indoor-navigation, augmented reality, image processing and analysis, artificial intelligence, machine learning, neural networks, measurements, context awareness, are state of the art in many of such devices.

Still, few of those general purpose sensors and systems are capable of achieving a reasonable accuracy and/or unambiguousness which is required for construction site tasks, so dedicated measurement and/or marking devices are in use.

Therefore, in many cases and some embodiments according to the invention, both kinds of devices can be involved in accomplishing the construction site tasks, preferably with a wired or wireless data link in-between them. In some embodiments according to the invention, some of the functionalities of such handheld computing devices can also be combined with above measurement and/or marking functionalities into a single piece of equipment for construction site usage.

To establish spatial measurement and/or markings for a worksite-task, the corresponding equipment has to be stationed somewhere at the worksite. The location of such a stationing can therein in general be of importance, not only in view of reasonability, obstructing its working area and an effective reachability of all of the desired measurements and/or markings, but also in view of reasonable accuracy, e.g. by avoiding low inclinations of a marking or measuring light beam with respect to a surface, glancing intersections, keeping within in range of the device or within a range of best accuracy for the given tasks, etc. A regular worker is in general not fully aware of all of such constrains and their interdependencies, but station the equipment at random or what he thinks to be intuitive and obvious. On the other hand, predefining a stationing location for the equipment in a forgoing planning phase at the office is often not feasible, as the actual construction site conditions are hardly predictable in all their details. For example, many unexpected items are likely to stand or lie about rather at random, like construction material, tools, ladders, waste, boxes, etc.

BRIEF DESCRIPTION

It is therefore an object of some aspects of the present invention to provide a method, system and/or device for improving a spatially referenced marking and/or measurement task at a construction worksite. A special object can therein be to avoid an inefficient stationing of such a device, an excessive re-stationing, an unfavorable stationing in view of accuracy and/or accessibility, a stationing in the way of the work, etc.

It is a particular object to achieve such in an at least partially automated, preferably automatic way, or at least with providing a user-guidance or an interactive procedure for the worker using the device to establish such a stationing, respectively a subsequent measurement and/or marking for a task he is confronted with.

Preferably, such is done—preferably, but not necessarily online—with an access to a database comprising at least one of a digital representation of a construction site related information, plans, schedules, actual state or progress information, construction worksite tasks to be established, etc., for example as in modern highly computerized and automated BIM-environment. In other words, it is one of the objects of the present invention to achieve a semi-automatic or automatic guidance for a sophisticated stationing of a measuring and/or marking device at a construction site, even for an unskilled worker.

Those objects are achieved by realizing the features of the independent claims. Features which further develop the invention in an alternative or advantageous manner are described in the dependent patent claims.

Some embodiments of the present invention relate to a method for automatically deriving and/or providing of stationing zones for an electronic measuring and/or marking device in a worksite environment. The device is therein configured for a measuring and/or marking at the worksite environment, in particular by an aimable light beam e.g. by a boning unit.

The method comprises a querying of a database or data file for construction plan information for the worksite environment and an acquiring of a worksite-task-information of a worksite-task to be executed. This worksite-task-information in particular comprises spatial points in the construction plan which have to measured and/or marked to accomplish the worksite-task. The method also comprises an acquiring of at least coarse 3D-data of the actual real world worksite environment and a geometrical merging of the at least coarse 3D-data and the construction plan information to form an actual state model of the worksite environment.

With an automatic calculating or deriving of at least one stationing zone within the actual state model, which zone comprise at least one stationing location from which the measuring and/or marking of the spatial points are accessible by the device without obstructions. In particular accessible in a unobstructed line of sight between the device and the spatial points.

Such can comprise virtually calculating a plurality of locations in the actual state model which are characterized by providing optimal or advantageous measurement and/or marking characteristics in view of the resulting measurement and/or marking accuracy for the spatial points of the worksite task. It can also comprise a providing of the one or more stationing zones for stationing the networked electronic measuring device to an operator for a coarse, physical stationing of the device, in particular by providing plan-view or an augmented reality view with the stationing zones marked. The invention can in particular be related to indoor construction site worksite tasks.

In addition, it can optionally also comprise a measuring of at least one measurement point at the worksite by the electronic measuring and/or marking device—which is stationed at one of the calculated stationing zones—for deriving a fine location information of the device with respect to the worksite as spatial reference for the spatial points to be marked and/or measured.

Therein, one of the stationing locations can be defined by at least one of:
a location from which a maximum number of the spatial points is accessible or within reach for the marking and/or measuring of the device, in particular the stationing zone can be defined by a plurality of worksite-locations that are characterized by avoiding obstructions in-between a virtually placed device and the points, e.g. by direct projection lines from the stationing location to the spatial points without obstructions;
a location from which the spatial points can be marked and/or measured by the device with an accuracy better than a defined threshold or preferably with a best possible accuracy in comparison to other stationing locations;
a location from which a minimized number of re-stationing of the device is required to cover all of the spatial points of the worksite task, preferably wherein a chronological order of the spatial points in the course of the worksite task is considered in avoiding re-stationing.

The capturing of the coarse 3D-model can therein be done by the measurement and/or marking device with a corresponding 3D-sensor-unit. A 3D-sensor-unit can in particular be embodied as a RIM camera sensor, a stereo imaging sensor, a structured light sensor, a triangulation sensor, a structure from motion sensor, a simultaneous location and mapping sensor, or a depth image sensor, in particular by carrying the device around at the worksite by an operator.

The capturing of the coarse 3D-model can optionally also be done by a handheld computation unit, e.g. utilizing its augmented reality framework, ARkit, ARCore, etc. By carrying it around at the worksite by an operator, all of the worksite task relevant portions of the worksite can be captured.

A providing of the stationing zones to an operator for a stationing the device at the worksite can then be established, which can comprise a visual marking of the stationing zone, in particular in a rendered 2D-view, a rendered 3D-view, an augmented reality view, a virtual reality view or by projecting am marking of the stationing zone at the real world worksite. The stationing zones for a stationing the device can therein comprise a 2D-floor plan area and a stationing height information for the device. The actual state model can be provided as an augmented reality view or as a virtual reality view, which comprises visual markings of the stationing zones.

After a stationing of the device within the stationing zone by a worker or operator, the method can also comprise an automatically checking and/or fine-referencing of an actual stationing location of the device, which can comprise a measuring a plurality of reference points at the worksite from the stationed device by a measurement functionality of the device.

An embodiment of the calculating of the at least one stationing zone can for example comprise a determining of projection lines from a spatial point to be marked and/or measured to an outline of an obstacle in the actual state model for deriving borders of the stationing zone. In particular wherein a safety margin can be applied to the outline in such a way that the size of the stationing zone is reduced. Such obstacles which are planned can be identified in the worksite plan and unplanned obstacles can e.g. be identified in the 3D-data, wherein a difference in-between the plan data and the 3D-data can reveal unplanned obstacles. In another embodiment, the outline of obstacles can be derived purely based on a numerical analysis the 3D-data. Such can e.g. comprise virtual projection lines, planes or volumes or a shadowing model from a source at the spatial point(s) into a room of volume confined by the 3D-data.

In an embodiment, the calculating of the at least one stationing zone can comprise a determining of an inclination angle between a line of sight from a putative stationing location and a surface at which the spatial point is defined. Those putative stationing locations which result in the inclination angle to be outside a defined threshold can then be excluded from the stationing zone.

The calculating of the at least one stationing zone can comprise a rating of stationing locations within the stationing zone according to an achievable accuracy of the measurements and/or makings from this stationing location. For example, the achievable accuracy can be evaluated according to a measurement geometry in-between the device and the spatial point. A specific measurement and/or marking characteristics of the device which is used can also be comprised. Such a rating of the stationing locations can be indicated by different markings or colors for indicating more or less optimal stationing locations within the stationing zones, e.g. with respect to a (at least theoretically) achievable accuracy and/or with respect to the number of points which can be covered.

Some aspects of the invention also relate to an electronic measuring and/or marking device, e.g. embodied as mentioned, which comprises a 3d sensor unit for acquiring the at least coarse 3D-data and with a computation unit configured for the method according to the invention. The electronic measuring and/or marking device can therein e.g. comprise an opto-electronic distance measuring unit (EDM) as at least one of the measurement functionalities of the device, a stationing means for stationing the device at the worksite and a pointing hinge for adjusting the direction of the distance measuring. The device can also comprise a powered deflection unit for deflecting the direction of measurement light of the electronic distance measuring unit, for automatically pointing the distance measuring into ascertainable directions to aim the spatial points. This can be done fully automatically, e.g. by motorized hinges with position encoders. Another embodiment without motorized hinges can comprise an indicator for guiding a user to hand-adjust the pointing hinge to point the distance measurement into the direction towards the measurement point. In particular latter can comprise a rough manual adjustment for pointing the measurement substantially in the direction of the spatial point—combined with a powered automatic deflection unit for fine adjusting the direction of the measurement and/or marking light.

Some aspects of the invention also relate to a system which is configured for the method according to the invention and which is comprising at least an electronic measuring and/or marking device and a thereof remote, handheld computation unit with a 3d sensor unit which is configured to derive the at least coarse 3d-data and with a display configured to visually provide the stationing zones.

The electronic measuring and/or marking device can be networked and comprise a data access unit built for establishing an automatic bidirectional—preferably online and substantially real-time—online wireless data communication link to the handheld computation unit and/or to database data at a remote server computer.

A device or system according to some embodiments of the present invention comprise microcontrollers, microcomputers, DSPs or a programmable or hardwired digital logics, wherefore the present invention can involve a computer program product with program code being stored on a machine readable medium, which implements functionality according to the invention at least partially in software—which therefore is also an embodiment of the invention.

The computer program product comprises program code being configured to execute and operate an automatically deriving of stationing zones for an electronic measuring and/or marking device in a worksite environment. Specifically, the code can comprise instruction sets for a querying of a database for a digital construction plan information for the worksite environment and an acquiring a digital worksite-task-information of a worksite-task to be executed, which worksite-task-information comprises spatial points in the construction plan which have to measured and/or marked to accomplish the worksite-task. The code also comprises instruction sets for an acquiring of at least coarse 3D-data of the actual real world worksite environment, e.g. from a 3D-sensor unit linked to a computation device, and a merging of the at least coarse 3D-data and the digital construction plan information to form or derive a digital actual state model of the worksite environment. The code then established an automatic calculating of at least one stationing zone within the actual state model, which stationing zone comprise at least one stationing location in the digital state model, from which the measuring and/or marking of the spatial points are accessible by the device without obstructions, preferably as described herein. In particular, the program code can be carried out on a digital computation unit of a device and/or of a system as presented herein.

BRIEF DESCRIPTION OF THE DRAWINGS

Devices, methods, systems, setups and computer programs according to the invention are described or explained in more detail below, purely by way of example, with reference to working examples shown schematically in the drawing. Specifically.

The diagrams of the figures should not be considered as being drawn to scale. Where appropriate, the same reference signs are used for the same features or for features with similar functionalities. Different indices to reference signs are used to differentiate between different embodiments of a feature which are exemplary shown. The terms "substantially" is used to express that a feature can, but in general is not required to be realized exactly up to 100%, but only in such a way that a similar or equal technical effect can be achieved. In particular slight deviation, due to technology, manufacturing, constructional considerations, etc. can occur, while still within the meaning of the scope.

DETAILED DESCRIPTION

Figure 1:
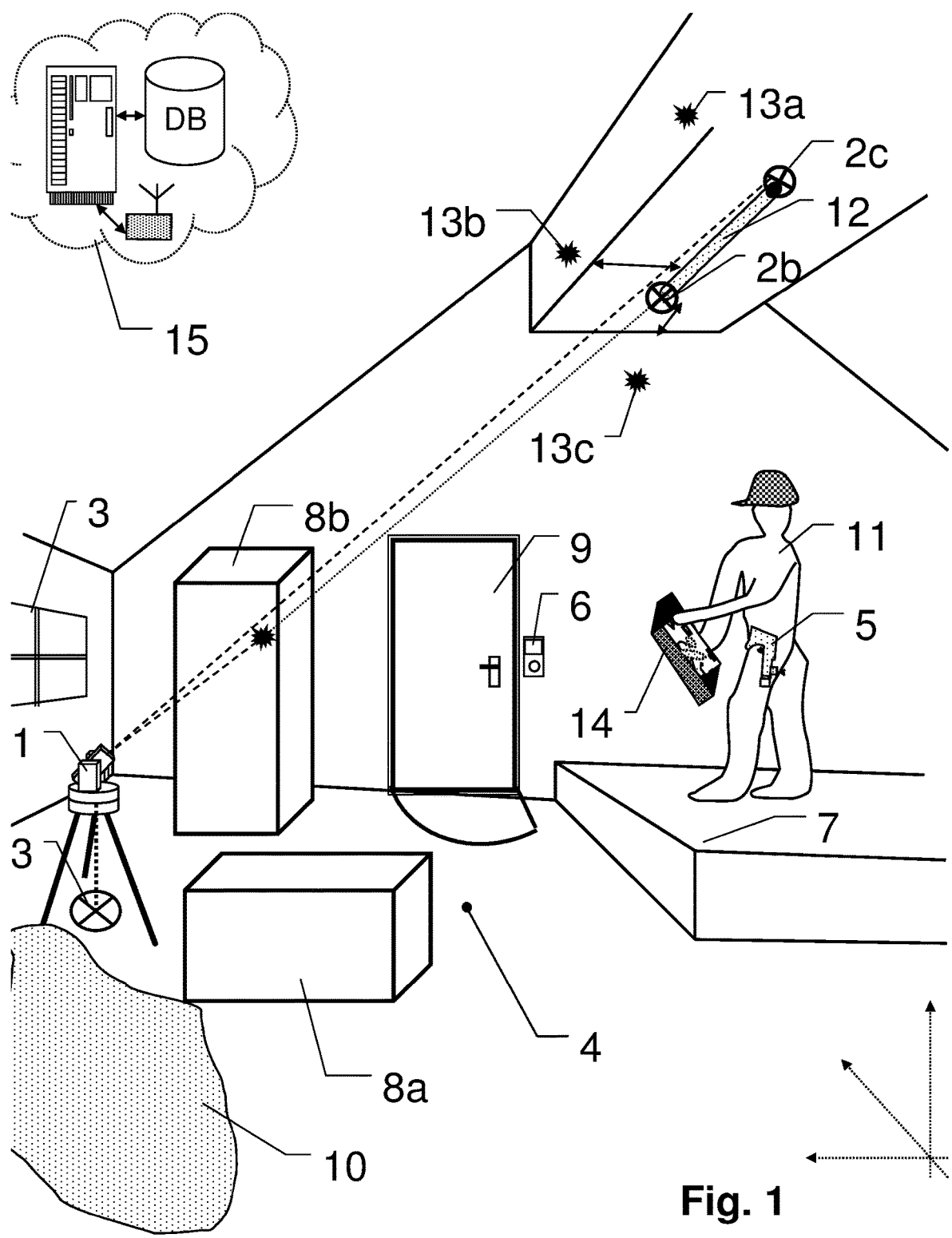
FIG. 1 shows an example of a first embodiment where the present invention is applied at a worksite.

FIG. 1 shows an embodiment of an example of the present invention at a building construction worksite location 4. The human worker 11 has a portable electronic measuring and/or marking device 1 for aiding him to accomplish a worksite task, like a construction task, a measurement task and/or a marking task.

There can be an online communication link to one or more databases DB, e.g. to one or more BIM server units 15, which can store a general construction database DB, comprising structured datasets of virtual object entities, which are representing the planned or already established physical construction components at the worksite. The database DB—or a synchronized, at least partial copy of it—can be accessed and/or at least temporarily be stored locally at the device 1, at a handheld computation unit 14 of the worker 11 or somewhere at or remote from the worksite 4. The database can in particular comprise or generate datasets of CAD- (Computer Aided Design) information of the physical construction components by which the desired construction result will be established. Beside those CAD data in machine readable form, the database DB can also comprise other attribute information of the physical construction components, like supply information, prices, variants, manuals, orders, order confirmations, accounting information. Besides the desired end result, the database DB also comprises actual-state information, which reflects the current progress within the build process, wherein the term "actual" is preferably a real time or almost real time state, but can also be updated in batches, e.g. after each task or sub-task, at the end of a working day or the like. The database DB also can also comprises information of an actual worksite task which has to be executed next by the worker 11. This worksite task information comprises a description of the task to be executed, in particular comprising spatial point information of the location at the worksite 4, at which the task has to be executed, for example, location in plan, dimensions, measurements, etc. Such worksite task information is usually provided at least partially in digital and/or machine readable form or otherwise manually entered in a computation system. Besides an at least partially automated providing of the worksite task information from a BIM database, it can also be provided to the worker 11 by his boss, preferably in at least partially digital form, e.g. sent to his mobile computation unit 14.

Yet, the above mentioned theoretical "actual state" of the worksite 4 does often not reflect all the peculiarities at a worksite 4. It is kind of usual that unexpected situation and items are to be found at the real world worksite 4. For example, there can be many items, like construction material 8b, toolboxes 8a, machinery, waste, construction components, etc. be lying around at the worksite or construction site. When using a measurement or marking equipment 1, such situations and items can influence the usage of a measurement and/or marking equipment 1.

To scope this, the present invention acquires at least coarse 3D-data of the real world worksite 4, e.g. captured by the measuring and/or marking device 1 itself, or by a separate device 14, which can be another measurement device or a handheld computation 14 device like a Smartphone, Tablet-Computer, etc. Therein, an accuracy and unambiguousness of such at least coarse 3D-data needs not be highly accurate. For example, dimensional accuracy in the order of magnitude of a few centimeters or decimeters will in general be sufficient. This 3D-data therein is in general not required to have—but optionally can have—a resolution which is accurate enough for the serious measurement tasks in the construction work—which in general e.g. requires a referencing in the order of magnitude of millimeters or centimeters.

In the shown example, the worker 11 can e.g. use his handheld computation device 14 to capture the coarse 3D-data of a room 4 the worksite in which he has to perform his task. For example, such can comprise a pointing and walking around with the handheld computation device 14, which device 14 comprises a unit which is built or configured for capturing 3D-data. The handheld computation device 14 can therein optionally also provide some guidance to its operator 11, which sections of the room 4 need to be captured in order to get a sufficiently complete coarse 3D-data of at least all of the worksite-task relevant sections of the room 4, optionally also of the complete room 4.

In another embodiment the measuring and/or marking device 1 can comprise such a unit which is built or configured for capturing at least coarse 3D-data. Latter can be at least partially established by the measuring functionality of the device 1 or it can be comprised as a separate, dedicated unit. For example, the at least coarse 3D-data can then be captured by the measuring and/or marking device 1 itself, e.g. from one or more random, estimated stationing by the worker, or by carrying around the device 1 while it is capturing the at least coarse 3D-data of the room 4.

Such a capturing of the at least coarse 3D-data—by the measuring and/or marking device 1 itself or by an external device such as e.g. the handheld device 14—can be established by a principle as known in the arts, e.g. by distance measurements according to time-of-flight (TOF) principles, according to triangulation calculations, according to structured light principles, according to stereo-imaging principles, etc. Capturing units for such can e.g. be a RIM-camera, a 3D-scanning unit, more than one 2D-camera arranged in a stereoscopic base, a light pattern projector and a 2D-camera, one or more 2D-cameras analyzed by a simultaneous locating and mapping (SLAM) algorithm, a structure from motion (SFM) analysis, etc. This evaluation can also comprise additional readings from inertia measuring units (IMU), gyroscopes, accelerometers, tilt sensors, a compass, etc. The at least coarse 3D-data can e.g. be derived in form of depth image, in form of a point cloud, in form of a 3D-model, etc.

The measuring and/or marking device 1 can be a type of device as e.g. mentioned in the preamble above. For example, it can comprise a unit for pointing a light beam into a desired direction, e.g. by moving the light source, moving some optical components for guiding the light beam and/or moving at least a portion of the device 1. This light beam can be a visual or invisible light beam which can be used for marking a desired spatial point, either directly or with aid of an additional detector or reflector. Therein, the markings can form points, lines or figures, e.g. by moving or scanning the beam and/or by shaping the light beam. The same and/or another light beam can be used to measure distances e.g. according to a time of flight, a phase and/or interferometrical measurement principle. Examples of such devices can be embodied similar to devices like a Tachymeter, a Theodolite, a Total Station, a Laser Scanner, a Laser Tracker, a Laser Rotator, a Laser Level, etc.

Based on the at least coarse 3D-data of the actual worksite 4 in combination with virtual plan data for the worksite 4, the present invention automatically derives preferable locations for stationing the device 1 for the forthcoming task, and provides such locations in form of preferred stationing zones 10 to an operator 11 who stationed the device. In a specific embodiment, the device 1 can also be comprised in an autonomous land or air vehicle, which will autonomously move into the provided stationing zone 10 or to a provided stationing location which was derived according to the invention. The stationing zone 10 can e.g. be a desired 2D-floor plan area, but can optionally also comprise a desired stationing height.

For achieving such, care has to be taken to station the device 1 at a location at the worksite, from where the device 1 will not be obstructed in its measurement and/or marking function. For example, as illustrated that a view from the device 1 to the marking locations 2b,2b, and/or to the measurement points 13a,13b,13c is not obstructed. At the shown stationing location of the device 1, a line of sight of the device 1 to the marking location 2b is obstructed by the cardboard box 8b, so this point cannot be marked, wherefore the shown stationing location is not advantageous for the present task of fixing the light 12.

In many embodiments one of the main criteria for selecting the stationing location can be to achieve the desired construction result (as it is defined in the worksite task information), without—or if not possible without then at least with as few as possible—re-stationing of the device 1. In other words, the initial stationing of the device should be optimized in its spatial location to achieve the desired spatial references required for the outstanding measurement and/or marking tasks of the present worksite task information. According to the invention there is a calculation unit, preferably comprised in the device 1, which is configured to achieve such by virtually numerically evaluating the lines of sight of the device 1 at a potential stationing location in the captured actual state model of the worksite 4, which can e.g. result in a rating of potential stationing locations according to their accessibility of the desired spatial points 2,13 from the worksite task information—wherein multiple locations can also be summed up to zones. In an advanced embodiment such calculation can also comprise some flexibility by equivalency considerations that can be derived from the worksite plan data or from the actual state model of the worksite. For example, the marking points 2b and 2c are spatially defined fixed points that do not allow an equivalent, but the thereto relative measurement points 13a, 13b, 13c are providing some flexibility, as those can be shifted within their wall-plane they are on without change of their technical effect. In another, here not shown example where only point 13c is obstructed from view, the present invention can, preferably automatically calculate an alternative solution to even use the actual stationing location 3 but to shift the otherwise blocked reference point 13c to an equivalent point at the same wall, which equivalent point will result in the same spatial reference, but which will not be obstructed.

Besides the above mentioned criteria of physical accessibility of the spatial points 2a,2b,13a,13b,13c which are demanded by the worksite task, in particular without obstructions or the like, an embodiment of the present invention can also take other criteria for evaluating preferable device stationing locations into consideration. For example, another important criterion of the measuring and/or marking is the achievable accuracy, like the achievable accuracy of a location of a marking, the achievable distance accuracy of a distance measurement, etc. As general example, a collimated laser beam for marking and/or distance measurement will provide best position and/or distance accuracy when the target is hit substantially orthogonal to the optical axis of the beam. Inclined hitting can also work out, but tend to increase uncertainty and/or be more prone to error when slight deviations occur.

Nevertheless, it is in most cases not feasible to aim each of the target points 2,13 substantially orthogonal to the target surface, when operating a device 1 from a single stationing location 3. But still, peculiar inclinations or acute angles can be avoided by selecting a reasonable stationing location 3, which is chosen in such a way that the desired spatial points 2,13 to be marked and/or measured are preferably substantially aimed in way that the marking and/or measuring is achievable with a substantially optimal accuracy—or at least within desired accuracy levels.

Also, specific measurement and/or marking devices 1 have their ranges of best accuracy. For example, for a theodolite is known that it can have certain disadvantages in the zenith or nadir direction or an opto-electric distance meter can have a known distance range of best accuracy, etc. By choosing a reasonable stationing location, the device 1 can be set up in such a way that the desired spatial points 2,13 to be marked and/or measured are preferably substantially within the range of best accuracy of the device 1.

In an embodiment of the present invention, a computation or calculation unit of the device 1 is configured to comprise at least one of above mentioned aspects in the automatic calculation of stationing zones for the device 1. Besides a mere unobstructed line of sight accessibility of the spatial points 2a,2b,13a,13b,13c from the stationing location, in addition also the achievable accuracy from this stationing location 3 can be comprised in the deriving of the stationing zones and/or in a rating or the stationing zones.

For example, the stationing location 3 can be numerically analyzed to derive if the spatial points 2a,2b,13a,13b,13c are (at least substantially) within a preferred measurement range of the device 1. The preferred measurement range can e.g. be a range which provides the highest possible accuracy) or if the measurements and/or markings of the spatial points 2,13 are at least substantially within a desired accuracy range threshold. In another example, additionally or optionally, the stationing location 3 can be numerically analyzed to derive if the spatial points 2a,2b,13a,13b,13c are (at least substantially) aimed at an angle of inclination, which will provide or result in a reasonable accuracy. Such can e.g. be judged from an angle of inclination from the device 1 to a surface of the target, or based on other geometry factors which can influence the achievable accuracy. In another example, also both of the above mentioned examples can not only be used separated, but can also be combined.

In an embodiment, such can e.g. result in a weighting coefficient for each potential stationing location—which coefficient can be presented to the operator 11 as rating for the best stationing locations. For example, by a color gradient from green (=best) to red (=worst) and/or by only providing those zones which have a certain level of weighting coefficient, or by some other indicator. By this in accordance with this rating, an operator can choose a preferable stationing location from the provided stationing zones in accordance with this rating.

The worker 11 can then station the device 1 about the stationing zone 10 provided to him, e.g. in a floor plan view at his mobile device 14. Once stationed, measurement capabilities of the electronic measuring and/or marking device 1 can determine and survey at least one measurement point 13 in a spatial environment of the electronic measuring device 1, preferably substantially automatically by the device 1. The electronic measuring device 1 can thereby derive its correct actual location with and can then measure in the direction towards the measurement and/or marking points 2c,2b as defined in the worksite-task. When doing so, in addition also further spatial information can be comprised, for example an orientation derived by a goniometer, a compass, a plumb- or level-direction derived by an electronic level or gravity sensor, or the like.

In the shown embodiment, multiple different measurement points 13a,13b,13c are used, which can be automatically chosen by the electronic measuring device 1 according to the construction plan information in such a way, that those measurement points 13a,13b,13c are geometrically best suited to resolve ambiguities or inaccuracies of the presently determined fine location information and/or to resolve the measurements and/or marking required for the worksite task to be established. For example, measurement points at some finalized, flat, solid construction work, like a finished concrete wall, can be such preferred measurement points 13a, 13b,13c are derived in the vicinity of the area where the worksite task has to be established. For the show worksite task of mounting a light 12, the corresponding worksite task information defines the locations 2b and 2c, where the worker 11 needs to drill mounting holes for mounting the light 12. Preferably the measurement points 13a,13b,13c can be predefined in the worksite task information or automatically derived by a computation system at (or data-linked to)

the device 1, e.g. automatically chosen to be in sections which coincide to the dimension required according to worksite-task-information. For example, the shown points 13a,13b,13c are chosen with respect to the desired locations of the mounting holes 2b,2c in such a way that they are configured to derive the planed dimensional measures as indicated by the shown dimensional arrows.

As shown in the figure, the shown stationing location 3 of the device 1 is dissatisfying. According to the invention there is a stationing zone 10 calculated from within which the device 1 can accomplish the necessary steps for the present worksite-task. In contrast to some other stationing, this zone provides physical accessibility to all of the desired points 2a,2b,13a,13b,13c. In contrast to a location at the pedestal 7 or underneath the lamp 12 to be mounted, it allows also an advantageous and accurate measurement of the points 13a and 13b—which would be error-prone from a location closer to the pedestal 7, in particular due to the fact that the measurement light would be almost parallel to the wall portion which comprises the points 13a,13b.

Once the fine location is defined within a predefined margin, but still not accurately enough to be considered final, according to the present invention, the further measurement points can be automatically selected at characteristic points within the construction plan information or an actual state information derived from the database. For example, such characteristic points can be three or more points defining a plane, two or more points defining a (preferably horizontal or vertical) straight, multiple points defining a (preferably perpendicular) edge or corner, etc. Those characteristic points can in particular be automatically selected in such a way, that they reduce a mathematical uncertainty of a concordance of the actual state nominal model and the real world measurement points taken by the electronic measuring and/or marking device 1, whereof a fine location of the networked electronic measuring device 1 is derivable. Detailed mathematical strategies for doing so can be derived from standard mathematical textbooks.

The above discussed embodiment of a coordinate controlled pointing and measurement laser system as measuring and/or marking device 1 can then e.g. be configured to survey sufficiently accurate spatial location information at the worksite 4, project an indication at defined location at the worksite 4 and/or survey other mobile client devices 5, executing entities 11 and/or construction components (like the window 3, electrical installation 6, pedestal 7, door 9, light 12, etc.—as other examples of worksite tasks. For example, the worker 11 can fix the window 3 at the correct location, which location is indicated and/or verified by the electronic measuring device 1. In another example, the electronic measuring device 1, which has been referenced at the worksite 4 according to the invention as described above, will project laser-light to mark the cut-out required for the electrical installation 6 which has to be made, which location is planed relatively to the door 9 and the floor. Therefore, the electronic device 1 will choose the edge of the door 9 and the presently not finished floor as characteristic points to be taken into account. In another example, the electronic measuring device 1 will survey the location of a tool 5 (e.g. a powered screwdriver, drill, etc.) and e.g. log the locations the tool 5 was used, optionally together with usage data like used time, torque, depth, which can be provided from the tool 5 by a wireless link, and then those tool locations and the optional tool usage data can be updated in the construction database at the BIM-Server 15.

Figure 2:
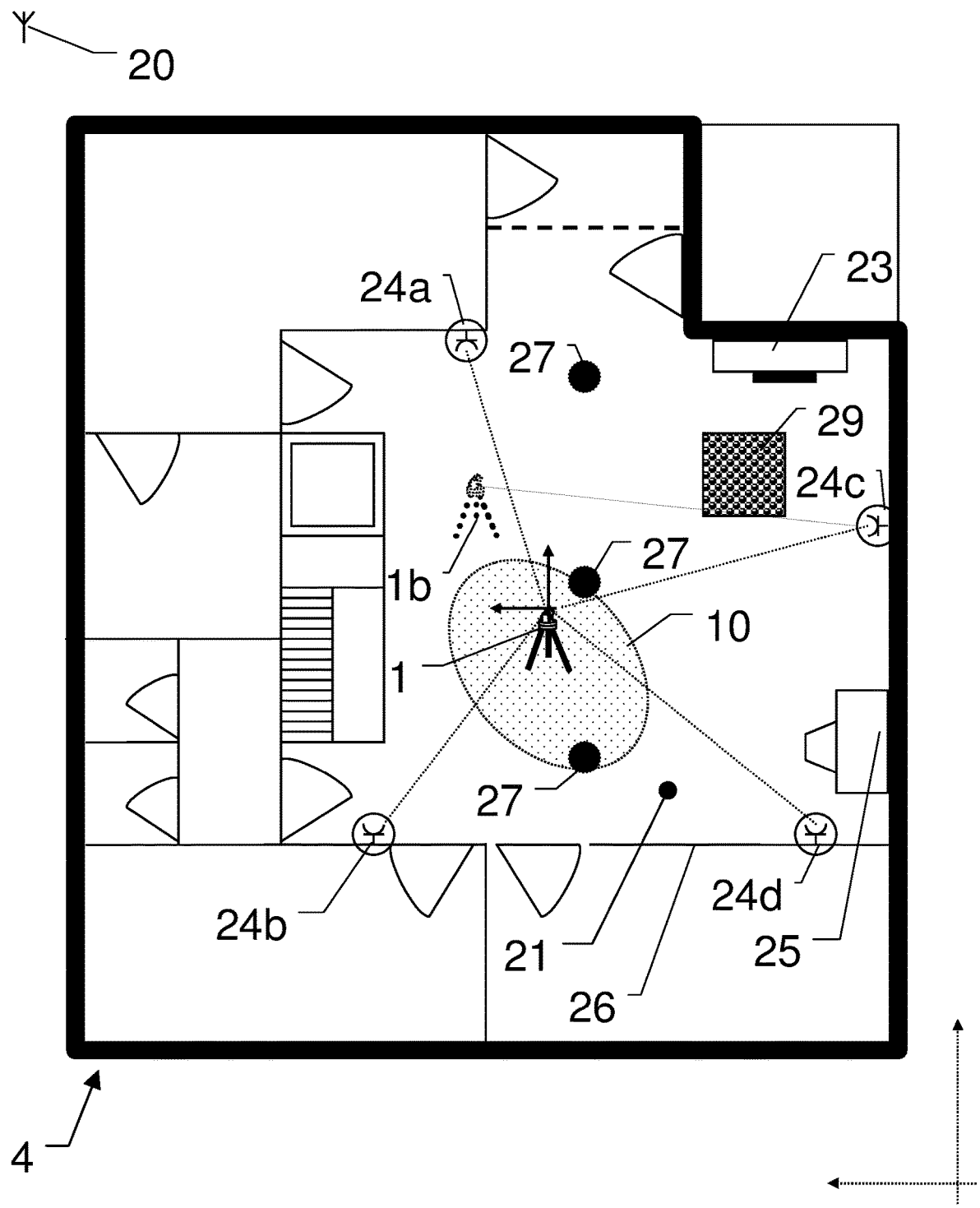
FIG. 2 shows an example of a second embodiment where the present invention is applied at a worksite.

FIG. 2 illustrates another embodiment according to the invention. It shows an example of a floor plan of a worksite 4. Therein, the electronic measuring device 1 is placed in one of the rooms 21 by a worker 11, who is given a certain worksite task to accomplish in that room 21, which worksite task comprises spatial referencing in form of measuring and/or marking. In order to choose a reasonable location for stationing the device 1, at least rough 3D-model data is captured at the worksite 4, which reflects an actual worksite state. This 3D-data is used together with the spatial points which have to be referenced according to the worksite task information, in particular combined with a theoretical construction plan of the worksite 4. Such information can be entered by the worker 11, but are preferably at least partially provided in a database. The present invention is therein configured to automatically derive advantageous stationing locations 10 for the device 1. In particular, this takes into account the fact that the actual worksite environment is in general not exactly as it theoretically should be according to the plan. Beside geometric deviations and tolerances, there are in general also many items 29,25,23, . . . around which are not found in the plan—like material, tool, auxiliary resources, waste, and other stuff.

For capturing or acquiring the rough 3D-data at the worksite 4, there can be a 3D-sensor used, which can be either at the device 1 itself or at a remote, preferably mobile computation unit 14. In a preferred embodiment, the rough 3D-data is not captured by a fix stationed 3D-sensor but by a mobile 3D-sensor unit which is moved around be the worker or which can also fly or drive around at least partially autonomously. The dimensional accuracy of the rough 3D-model does not have to be production level—which means it needs not to match the desired accuracy which is required for the worksite task—in particular not in each and every detail. This not only reduces capturing time and computation effort, but also opens the field to a variety of 3D-data capturing approaches of lower quality like structure from motion, Simultaneous mapping and location, stereo-imaging, triangulation, low resolution RIM-cameras, etc.

By a combining or conglomeration of the rough 3D-data together with the virtual plan data to which plan the dimensional requirements of the worksite task are related to, there is a data-basis established, based on which according to the invention stationing locations 10 for the device 1 can be evaluated virtually.

In the illustrated example, the worksite-task is to fix electrical sockets 24 in a renovation of a building 4. The corresponding worksite task information comprises a plan of the worksite with dimensional information regarding the placement of the sockets 24 (24a,24b,24c,24d). The worksite task information or plan is preferably provided in form of digital data, or otherwise the relevant data can be digitized by the worker 11. In particular, the spatial location points at which the sockets 24 have to be fixed are relevant for the present invention. The room 21 is therefore roughly scanned in three dimensions, in particular as an existing plan might not be fully up to date, and that there is also unplanned furniture 25,23 and also a box 29 of material present at the worksite 4—which obviously is not to be found in any plan. The resulting, at least coarser 3D-data is then evaluated together with the worksite task information, which comprises the spatial locations of the points 24a,24b,24c,24d in the room 21, where the sockets have to mounted. Such is done by a handheld computation device, by the measuring and/or marking device 1 or by a combination of both. This results in an actual state model of the worksite. The present invention then automatically calculates at least one stationing zone 10, based on this actual state model, which also comprises the unplanned obstacles 25,23,29. There are also some planed obstructions, like the pillars 27, which are comprised in both, the construction plan and the 3D-data. The at least one stationing zone is therein characterized by the fact that from a device 1 which is stationed in this zone, an optimum number of the points 24a,24b,24c,24d for the worksite task can be covered in way reasonable to fulfill the worksite task, in particular with reasonable or desired dimensional accuracy. The optimum number preferably comprises all of the points 24a,24b,24c,24d for the worksite task or at least a subset thereof, which requires a minimum number of re-stationing of the device, if re-stationing is unavoidable. In the deriving of the optimum there can also be an evaluation of the planed work-flow that can be comprised in the worksite task information, in particular in such a way in the work-flow sequent back and forth stationing is avoided, or in other words a temporal first portion of the work-flow can be established from a first stationing and following second portion can be established from the second stationing, preferably without the need to subsequently revert to the first stationing again.

As mentioned there can be an online communication link 20 of the devices to a computation unit, in particular to a worksite-database server 15 and/or to a handheld computation device 14 which the worker 11 can used to control, configure or use the device 1, for example also as an optional and/or additional alternative to a user-interface at the device 1.

The device 1 stationed within the provided stationing zone 10 can then mark all the desired locations of the sockets 24, e.g. a point at the wall 26 at which the socket-outlets 24b and 24d have to be established. A stationing as indicated by 1b would theoretically—according to the construction plan—do as well, but practically unplanned the box 29 obstructs its aiming to socket 24c—wherefore this stationing location is inadequate or not optimal for the present worksite task.

Figure 3A:
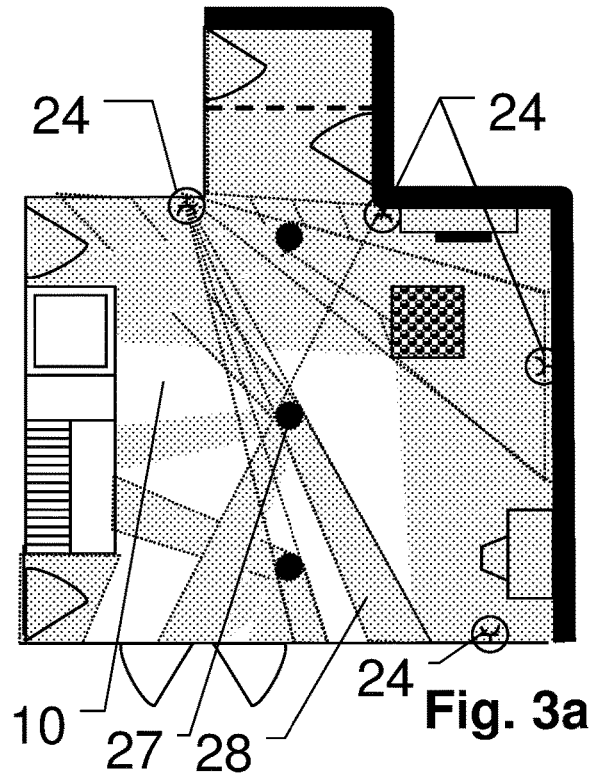
FIG. 3a shows a first example of an embodiment of stationing zone according to the present invention.

In an example of a simple illustrative embodiment in FIG. 3a, zones of potential stationing locations from which projection lines from all of the spatial points (of the sockets 24) required according to the worksite task information can be calculated and those regions which are shadowed by some obstacles in the 3D-data can be excluded from the potential stationing locations. For example, for the upper left socket 24, the region 28 is obstructed by pillar 27, wherefore this region has to be excluded from the stationing zones 10 for the device 1 for marking this socket 24. The obstructed regions, which are no optimal for a stationing of the device 1, are marked gray in the figures, wherein only some of the related projection lines for the spatial points of the sockets 24 are explicitly shown to avoid confusion. Those obstructions comprise planned and unplanned obstructions at the worksite 4. The potential stationing zones 10 for the device are therein the ones which are left white. The present invention can obviously also be worked in three dimensions, for example wherein the shown gray areas will constitute volumes, etc.—but such is not illustrated as it would be confusing. Apparently, according to the invention also more complex numerical approaches than the shown projection lines can be used for achieving a the same or a similar technical effect of deriving stationing zones 10 which are advantageous for the present worksite-task, and optionally also for subsequent worksite-tasks.

In one of the possible variants, e.g. the borders of such projection lines from the desired point and along the outlines of the obstacles can be evaluated, resulting in an area or volume from which the desired point is accessible. Therein, a safety or tolerance margin can comprise making the volume slightly smaller than calculated, in particular to the scope with the coarse 3D-data tolerances, manual stationing tolerances, and to give some flexibility, etc. The volumes for each of the points from the worksite task can then be intersected, resulting in potential stationing volumes or zones, from which the device can fulfill all of the requirements for the worksite task. In cases that there is no zone 10 from which all of the requirements can be fulfilled, the present invention can be configured to calculate a selection of multiple stationing zones from which all of the requirements can be fulfilled, wherein a minimum number of re-stationing can be a criterion for selection.

In an embodiment, besides the basic line of sight accessibility of the spatial points by the device 1, the areas or volumes described above can also be restricted by other constraints. For example, such restrictions—in form of so called hard-criteria—can comprise device specific constrains, like a limited operating range of the device, specific stationing ranges and limits of the device, etc. For example, a device is physically blocked of accessing a certain region by its construction, or the stationing height for the device is limited, a stationing can only be established up to a certain tilt of the ground at the stationing location, the device is stationed by fixing it to a wall, etc.

Figure 3B:
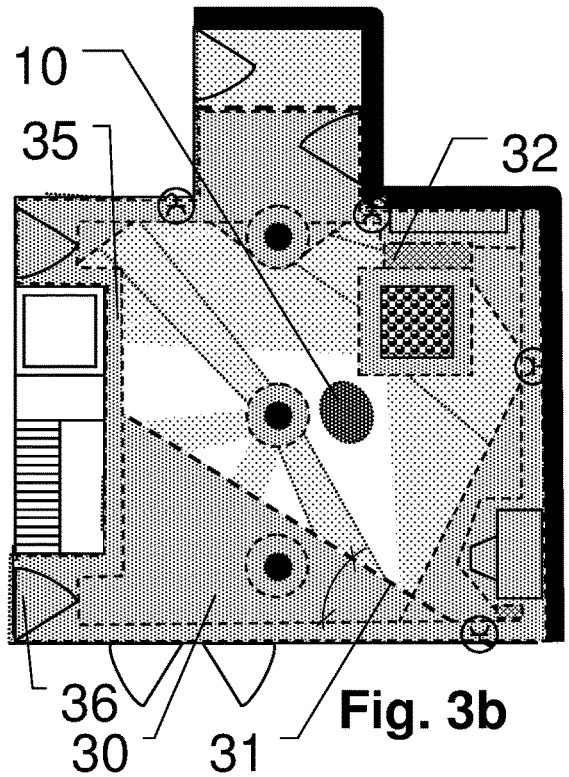
FIG. 3b shows a second example of an embodiment of stationing zone according to the invention.

FIG. 3b shows an example of an embodiment according to the invention, where there are additional restrictions for the specific device 1 in place. In comparison to FIG. 3a, the darker marked locations 35 (in the lower left corner), which would allow a physical line of sight to all the desired spatial points of the desired socket-locations are taken out of consideration. For example, because of the fact that the socket at the lower end of the floor plan would be aimed with a beam of light that is almost parallel to the wall it is projected to—such can be disadvantageous in view of accuracy, as e.g. the therein only a slight deviation or inaccuracy in the pointing angle can have a rather large dimensional error of the aimed point (and would lead to a misplaced socket). Also, the marking at the wall would be deformed by the flat striking angle. For example, this can be accomplished by defining a minimum angle—e.g. as indicated by the dashed line 31 and by omitting the area 30 from the stationing zones 10.

Another restriction which is also shown is the consideration that a stationing directly at a wall or other obstacle (as it can be derived in the actual state model resulted from the 3d-data of the actual worksite 4) is not possible. In many embodiments (also in the shown) some minimum wall-distance will be required, e.g. for a tripod by which the device 1 can be stationed. In other embodiments the device 1 will be actually mounted to a wall or item, so that only wall-portions are valid stationing zones 10. In general, it will be more practically to leave some margin from the derived borders of the white potential stationing zones 10 which are derived e.g. in FIG. 3a, in which white zones a device stationing would in general be feasible. In particular, when the device 1 is stationed manually by a worker, there will always be some tolerance in the stationing. Optionally, additional considerations can automatically be taken into account, like that a stationing right behind a door 36 is to be avoided, or that small zones 32 are inadequate for a stationing and therefore omitted as well. Such can e.g. be derived from a construction plan data and/or the 3d-data.

In another embodiment, it can e.g. also be considered that a stationing somewhere in vicinity to an item, obstacle or wall can be advantageous in view of otherwise obstructing a path for workers and/or a risk of knocking the device 1 over. In view of this, e.g. the marked zone 10 can be automatically calculated according to the invention to be a preferred zone 10 for stationing the device 1. For example, in view of a combination of the impinging angels to the surfaces to be marked, in view of all the marked points being within an advantageous working range of the device, in view a well-balanced distribution of the target distances and/or impinging angels, etc.

The shown, accordingly marked plan-view of the worksite marks some examples of inappropriate or disadvantageous regions in dark color and can be considered as an optionally enhanced version or second step of FIG. 3a. The white zones in this view are the remaining, potential stationing zones, wherein the dark marked stationing zone 10 can be derived to be the most prominent candidate for a stationing of the device 1, e.g. in view of sight, accessibility, being out of the way, and/or for the aspects discussed in the following.

Figure 3C:
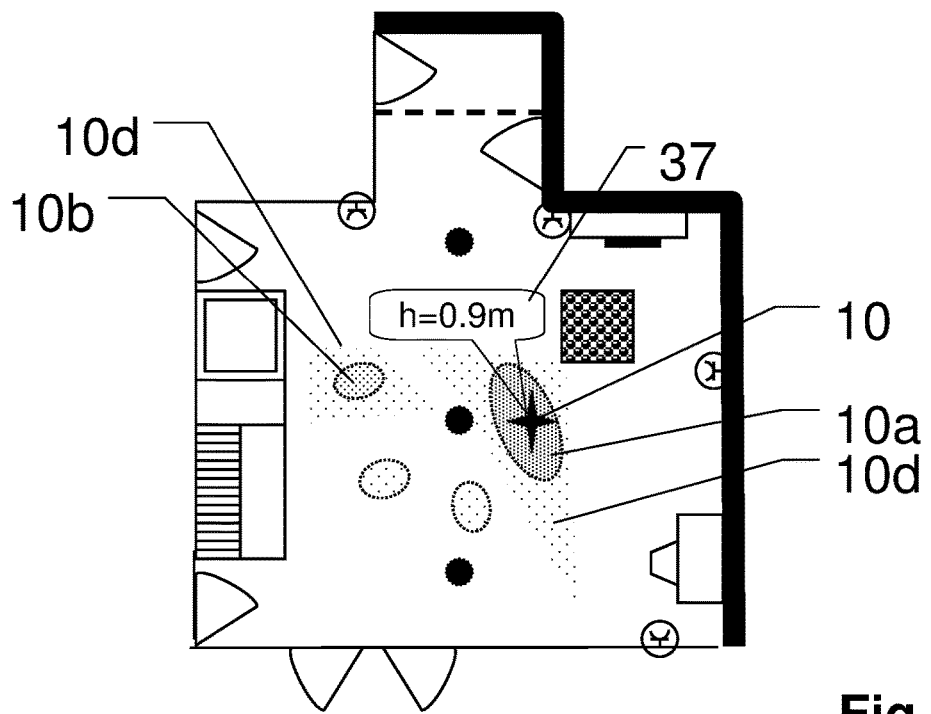
FIG. 3c shows a second example of an embodiment of stationing zone according to the invention.

In an embodiment as shown in FIG. 3c, also other criteria—in form soft criteria—can be considered. While above hard criteria are binary ratings of a location, which make a location or zone "possible" or "impossible" (like the fact that measurement or marking light is blocked by something or not)—those soft criteria give a gradual rating of a location in more than two discrete values. For example, the potentially achievable measurement accuracy can be dependent on the surface inclination of a measurement and/or marking beam at the desired spatial target point. Such can be at least partially evaluated in form of a hard criteria, e.g. by defining a threshold that target surface inclinations below e.g. 70 degrees are excluded from the zones or volumes mentioned above. But those can also be at least partially evaluated as soft limits, by rating volumes or portions thereof gradually, e.g. wherein 90 degrees is the best (100%) and 40 degree or below is unacceptable (0%). Those ratings for all of the desired points can then be conglomerated in such a way that it results in a rating of the zones or volumes regarding their (expected) accuracy results, either in discrete steps, gradually or continuously.

Besides the above used illustrative examples of target surface inclination, also other factors which influence the accuracy can be used as soft criteria in a similar manner. For example, like a distance measurement accuracy, which degrades above and/or below a certain distance range the opto-electronic distance meter is designed for—which can be used as another criteria for soft-rating or hard-limiting the calculated stationing zones or volumes—to name just one of those, as those soft criteria can be highly device 1 specific.

The figure specifically indicates an example of a possible presentation of the automatically calculated preferred stationing zones 23 for the device 1 in a floor plan view of the worksite 4—in particular as such is less complex and better comprehendible by a human worker 11 than the option of FIG. 3a or FIG. 3b. This example also comprises a rating information of the zones 10, wherein the mark 10 reflects the most preferable stationing location, the darker shape indicates also desirable zones 10a, and the lighter shapes indicate other zones 10d which can work out as well, but which are not as adventurous as the darker ones, e.g. in view of an achievable accuracy or other rating factors. Also shown is an optional indication 37 of a preferred stationing height, which can in this example be about the height of the sockets 24 to be mounted.

Besides such a 2D floor plan illustration, the desired stationing locations can also be provided in other forms to the worker 11. For example, an isometric 3D-view, a virtual reality view, an augmented reality view, etc. can be presented—which can for obvious technical reasons not be graphically illustrated in this document. Another option according to the invention is that the device 1 uses its marking functionality to mark a preferred stationing zone 10 directly at the worksite 4, so that the worker 11 can then station the device 1 at or about this marked location. Latter can be in particular advantageous for a re-stationing of the device 1 at another location, if such is required as not all of the spatial points of the worksite task can be accessed from a single stationing.

For example, in a special embodiment, the device 1 can at first be randomly stationed by the worker at a location at the worksite, which he assumes to be a good one. The device 1 will then automatically reference itself to the room, (e.g. as in EP 3 222 969) and will in particular try to measure the spatial points for the task. If such does not resolve with the construction plan, the device can automatically calculate a preferred stationing location according to the invention, wherein the measurements taken for the referencing of the device can at least partially form the coarse 3d-data. The device 1 can then e.g. automatically indicate a new stationing location directly at the worksite by its marking functionality and direct the worker to re-station the device 1 accordingly. Optionally, this special embodiment can be looped until an appropriate stationing location is found.

In any embodiment, when the device 1 is stationed in the stationing zone, it can optionally measure its exact location within the worksite plan, preferably automatically. Thereby not only an exact spatial reference with respect to the worksite can be established, but also the stationing location can be verified to be within one of the desired zones 10—and can prompt the worker 11 for a re-stationing if latter is not the case, preferably with an indication of a desired direction and/or distance for the re-stationing.

Figure 4:
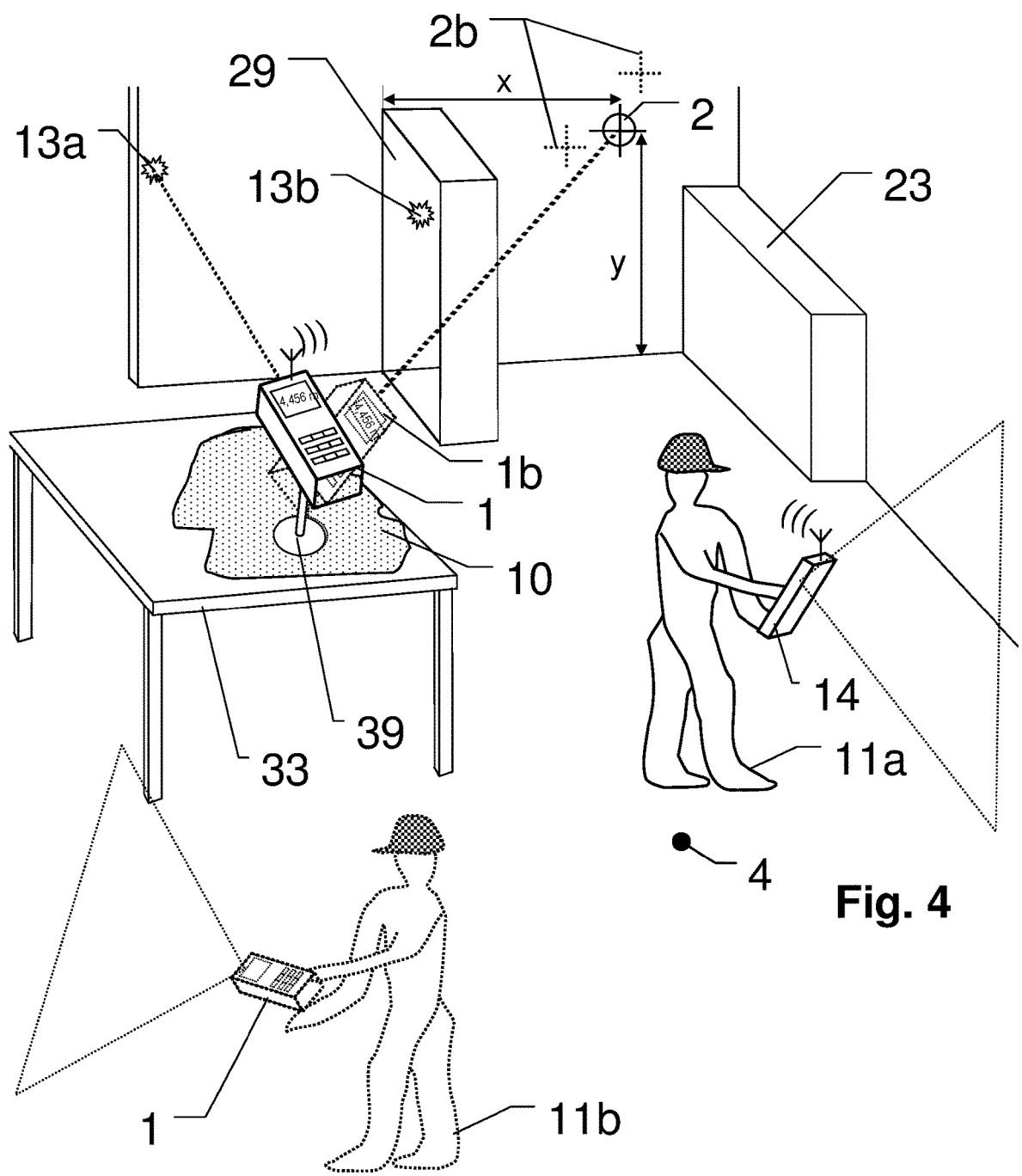
FIG. 4 shows an example of a third embodiment where the present invention is applied at a construction worksite.

FIG. 4 shows an example of an embodiment of the present invention at a worksite 4. The worker 11 has received a worksite task information in at least partially digital from his principal. The worksite task information comprises some plan and dimensional properties of the task. He then uses a 3D-capturing unit to derive at least coarse 3D-data of the actual worksite 4. Worker 11a is shown doing so by using a handheld device 14, like a mobile computation device, which can besides a dedicated device also be embodied as a Smartphone, Tablet-Computer or the like. Worker 11b is shown to gather the 3D-data by the device 1 which he will be using for his worksite task as marking and/or measuring tool. The device 1 is here shown embodied as a portable visual laser measurement device. The shown device comprises an opto-electric distance meter and a measurement unit for deriving coordinate information of the direction in which the distance meter points, e.g. goniometers, tilt sensors, etc. There is also a means 33 for stationing the device 1 at the worksite, like a tripod or another stand or fixing unit. In other embodiments the device 1 can also be embodied as a tachymeter, total station, laser scanner, laser tracker, line laser, etc. or some similar electronic device configured to provide the functionality of measuring and/or marking spatial points at a worksite from a location at which the device 1 is stationed.

According to the invention, the device 1 (or optimally the handheld computation unit 14 or a remote server—if either is used) it therein configured to automatically calculate stationing locations or stationing zones 10 for the device 1. Those stationing locations are characterized in that they take into account an actual worksite model—which can primarily be based on the 3D-data—and the worksite task information—in particular plan-data and spatial points which have to be measured and/or marked at the worksite 4 to accomplish the worksite task. Those automatically derived stationing zones 10 can be characterized by providing a substantial optimum for the worksite task, in particular in view of one or more of the criteria of:

- an line of sight accessibility from a device 1 at the stationing location to the spatial points 2,13 of the worksite task;
- a minimized number of re-stationing of the device 1 to fulfill the worksite-task, preferably no re-stationing;
- an above a required limit or maximized accuracy of the measurements and/or markings of the spatial points by the device 1, in particular according to the geometry of the measurements and/or markings, comprising for example at least one of
  - an device specific accuracy range of the device 1,
  - a minimum inclination of a measurement and/or marking beam with respect to its target surface at the worksite,
  - etc.;
- a minimum clearance or margin to a limit or border region 35, in particular to scope with the coarse nature of the 3D-data and/or manual handling inaccuracies of the device 1;
- a rule based logical evaluation of advantageous or disadvantageous stationing locations 32, in particular specifically for the device 1.

In the exemplary shown worksite task comprising a drilling of a cable duct 2 at a spatial position according to the worksite task information, the x and y dimensions are given.

The worker uses the device 1 to automatically derive this location and to mark the respective spatial point 2 at the worksite 4 by the shown light marker which projected by the device 1 at the correct location. According to the worksite task, the worker 11 has to drill holes for two fixing bolts at defined spatial points 2*b* relative to the duct 2, to which bolts the concrete bulkhead will be attached for the drilling process. By accessing the worksite task information data and the actual state model of the worksite 5 which comprises information from the 3D-data, one or more stationing zones 10 and/or stationing locations which are advantageous for fulfilling the worksite-task are automatically derived, wherein obstacles 23 and obstructions 29 at the actual real world worksite 4 are considered, which are not necessarily included the construction plan of the worksite 4 that was provided to the worker 11 and/or device 1. Those stationing zones 10 are presented to the worker, e.g. on a display at the device 1, at his mobile device 14 or by another rendered, augmented or virtual reality display. For example, a 3D-view or a floor plan similar to the one of FIG. 3*c* is presented on a screen. The worker then stations the device 1 within this provided stationing zone 10. In the shown example, the already present table 33 was chosen as a preferable stationing zone 10, which zone is indicated to the worker 11 e.g. on a plan view or at the actual worksite 4. Such can also comprise additional information about the stationing, e.g. the stationing equipment 39 required (in this case a table-stand instead of a large tripod), an at least approximate stationing height, etc.

The stationed device 1 can then automatically spatially references itself to the worksite 4 by one or more measurements 13*a*,13*b*, in particular in such a way that the spatial reference for the desired dimensions x and y of the worksite-task is establish with a level of accuracy that is required for this task, which will be in the range of a few centimeters or below, preferably a few millimeters or sometimes even less. In general, with an accuracy better than the one of the coarse 3d-data that had been captured. The measurement points 13*a*,13*b* can also be comprised explicitly in the worksite task information.

The device 1 can then automatically mark the spatial points 2*b* for the bolts at the worksite wall by light markers, as the worksite task information comprises data of the concrete bulkhead tool used whereof it can be derived where the bolts have to be placed. In another embodiment, at least some of the data, (like the tool used, or the relative locations of the bolts, etc.) can be entered manually be the operator. The worker sets the bolts at those marked spatial points 2*b* at the wall, fixes its drilling tool and accomplished the worksite task at the spatial point 2. The device 1 can then also mark or project the desired result for the worker to verify its task, and/or the device 1 can automatically measure the result of the worksite task and store this information for documentation of the as-built information, which can e.g. be stored in a BIM-database.

Figure 5:
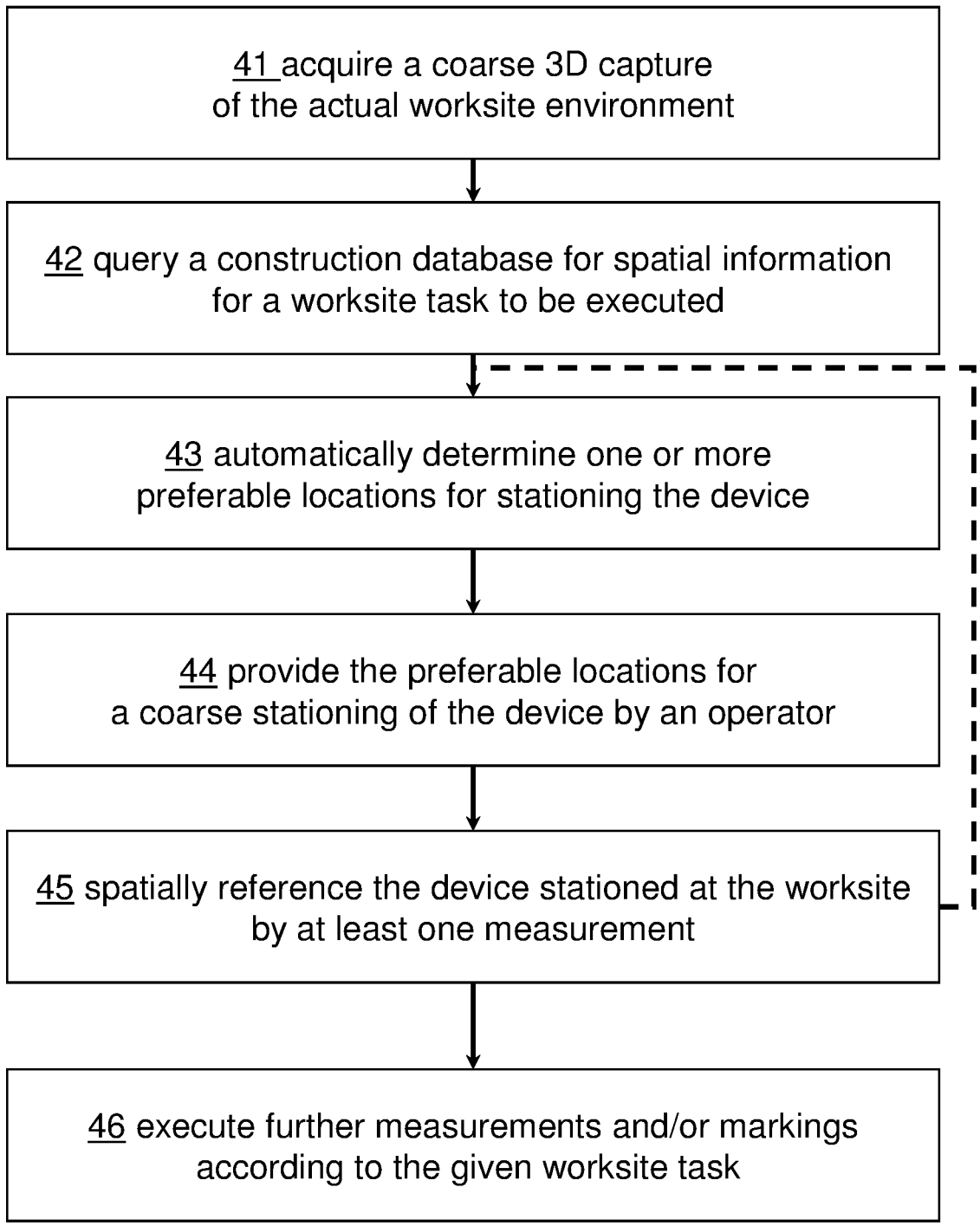
FIG. 5 shows an example of a data flow diagram according to the invention.

FIG. 5 shows an example of a simplified flow diagram of an embodiment of the present invention.

Box 41 symbolizes, to acquire rough or coarse 3D-data of the actual real world worksite environment, for example by a 3D sensor unit embodied as one of the exampled mentioned above. Therein, coarse means that this 3D data needs not to have production level accuracy in the order of magnitude as the worksite task demands. A main aspect is to locate and/or identify unplanned obstacles and/or deviations from a plan of the worksite. Such can e.g. be done by walking driving or flying around a 3D-sensor unit within a room until an amount of 3D-data is captured which is comprises at least the worksite-task relevant portions of the worksite.

Box 42 symbolizes, to query virtual worksite information, for example plan data and/or other spatial information regarding the worksite and the worksite task to be executed. Such can be done by accessing data files and/or a construction database comprising spatial information in machine readable from. Optionally, also an entering of such information by the worker can be used for acquiring this data. This can be done in various ways as discussed above. For example, directly or indirectly via a wireless or wired communication link, directly or indirectly to a database server, synchronizing local copies of the database, etc. The spatial information can in particular comprise machine readable spatial construction data, at least of the theoretically planed worksite.

On basis of above, a so called actual state model of the worksite can be derived, in particular by joining, assimilating or conglomerating the real world 3D data and the planed data.

Box 43 symbolizes, to automatically determine one or more preferred stationing locations for the marking and/or measuring device, wherein a plurality of such stationing locations can form one or more stationing zones or regions. This can be done in at least one of the different ways elaborated above, e.g. by at least one of the examples and approaches as described above. Such can also involve a rating of potential stationing locations according to feasibility and/or accuracy considerations than can be calculated, wherein the best rated regions or zones of locations will be presented to the entity which is responsible for stationing the device 1.

Box 44 symbolizes, a providing or presenting of the above derives stationing zones to the worker in such a way that he is thereby enabled to station the device 1 substantially within or at this stationing zone 10. Such can preferably be done visually, e.g. by a rendered plan-view or a 3D-view on a screen, or by an augmented reality or virtual reality view, in which the stationing zones or locations are visually marked, or by a visual marking of the stationing zones or locations at the worksite, e.g. by a marking functionality of the device 1 or by a handheld computation unit. The providing can be done in two dimensions, e.g. in a floor plan, or in three dimensions, e.g. by additionally providing an at least approximate stationing height. The worker will then station the device 1 substantially within the provided zone, which is mostly not highly critical to be exact as the zone will in general be chosen and provided with a reasonable margin, so that a manual stationing at a location which is estimated by the operator to be fitting within the zone will in general be sufficient.

Box 45 symbolizes, to measure at least one point of the worksite by the device, in order to get a spatial reference of the device with respect to the worksite, in particular in such a way to establish a reference for the spatial points of the measurements and/or marking required for the worksite task. In particular, such is done in a way that the electronic measuring devices location and/or orientation with respect to the worksite will be referenced to level of accuracy being sufficient with respect to the following task to be accomplished by the networked electronic measuring device, optionally with multiple iterations until the virtual plan data and the measurements of the worksite are matched to this level of accuracy.

Therein, also the stationing location can be verified to be within the provided stationing zone. If latter is not sufficiently given there can optionally be an iteration loop of the stationing of the device 1. In embodiment such loop can comprise a marking of a better stationing location at worksite by the marking functionality of the device.

Optionally there can also be a verifying of the desired spatial points 2,13 to be marked and/or measured, e.g. by aiming and measuring those points 2,13 and compare results with the expected or known ones—which would result in a deviation if there would be some obstacle 25,23,29 in the way.

Box 46 symbolizes an executing of the further measurement and/or marking tasks of the planed worksite task to be established from the device as stationed. If a re-stationing of the device is necessary in the course of the worksite-task, the device 1 and/or a handheld computation unit 14 can indicate this to the worker provide a second stationing location similar as described above.

A skilled person is aware of the fact that details, which are here shown and explained with respect to different embodiments, can also be combined with details from other embodiments and in other permutations in the sense of the invention.

What is claimed is:

1. A method for automatically deriving stationing zones for an electronic measuring or marking device in a worksite environment, which device is configured for a measuring or marking at the worksite environment, the method comprising:
    querying a database for a construction plan information for the worksite environment;
    acquiring worksite-task-information of a worksite-task to be executed, which worksite-task-information comprises spatial points in the construction plan which have to measured or marked to accomplish the worksite-task;
    acquiring of at least coarse three-dimensional (3D) data of the actual real world worksite environment;
    merging of the at least coarse 3D-data and the construction plan information to form an actual state model of the worksite environment; and
    an automatic calculating of at least one stationing zone within the actual state model, which zone comprise at least one stationing location from which the measuring or marking of the spatial points are accessible by the device without obstructions.

2. The method according to claim 1, wherein the stationing location is defined by at least one of:
    a location from which a maximum number of the spatial points is accessible for the marking and/or measuring of the device;
    a location from which the spatial points is marked or measured by the device with the best possible accuracy;
    a location from which a minimized number of re-stationing of the device is required.

3. The method according to claim 1, wherein the capturing of the coarse 3D-data is performed with a corresponding 3D-sensor-unit.

4. The method according to claim 1, wherein capturing the coarse 3D-data is performed a handheld computation unit carried at the worksite by an operator.

5. The method according to claim 1, wherein after a stationing of the device within the stationing zone, an actual stationing location of the device is automatically checked or fine-referenced by the device by measuring a plurality of reference points at the worksite from the stationed device by a measurement functionality of the device.

6. The method according to claim 1, wherein providing the stationing zones to an operator for a stationing the device at the worksite comprises a visual marking of the stationing zone.

7. The method according to claim 1, wherein the stationing zones for a stationing the device comprise a two-dimensional (2D) floor plan area and a stationing height information for the device.

8. The method according to claim 1, wherein the actual state model is provided as an augmented reality view or as a virtual reality view, which includes visual markings of the stationing zones.

9. The method according to claim 1, wherein calculating of the at least one stationing zone comprises determining projection lines from a spatial point to be marked or measured to an outline of an obstacle in the actual state model for deriving borders of the stationing zone.

10. The method according to claim 1, wherein calculating the at least one stationing zone comprises determining an inclination angle between a line of sight from a putative stationing location and a surface at which the spatial point is defined, and excluding the putative stationing locations from the stationing zone which result in the inclination angle to be outside a defined threshold.

11. The method according to claim 1, wherein calculating the at least one stationing zone comprises rating stationing locations within the stationing zone according to an achievable accuracy of the measurements or makings from this stationing location.

12. The method according to claim 11, wherein rating of the stationing locations is indicated by different markings or colors for indicating more or less optimal stationing locations within the stationing zones.

13. An electronic measuring and/or marking device comprising a 3D sensor unit for acquiring at least coarse 3D-data and a computation unit configured for the method according to claim 1.

14. A system configured for the method according to claim 1, comprising an electronic measuring or marking device and a remote handheld computation unit with a 3D sensor unit which is configured to derive the at least coarse 3D data, and with a display configured to visually provide the stationing zones.

15. A computer program product with program code being stored on a machine readable medium, the program code being configured to automatically derive stationing zones for an electronic measuring or marking device in a worksite environment, wherein when executed, the program code causes the computer program product to perform a series of operations, the operations comprising:
- querying a database for a construction plan information for the worksite environment;
- acquiring worksite-task-information of a worksite-task to be executed, which worksite-task-information comprises spatial points in the construction plan which have to measured or marked to accomplish the worksite-task;
- acquiring of at least coarse three-dimensional (3D) data of the actual real world worksite environment;
- merging of the at least coarse 3D-data and the construction plan information to form an actual state model of the worksite environment; and
- an automatic calculating of at least one stationing zone within the actual state model, which zone comprise at least one stationing location from which the measuring or marking of the spatial points are accessible by the device without obstructions.

* * * * *